US005688633A

United States Patent [19]

Leach

[11] Patent Number: 5,688,633
[45] Date of Patent: Nov. 18, 1997

[54] SOFT RELIEF PHOTOPOLYMER PRINTING PLATES FOR FLEXOGRAPHIC PRINTING

[75] Inventor: Douglas R. Leach, Wilmington, Del.

[73] Assignee: MacDermid Imaging Technology, Inc., Waterbury, Conn.

[21] Appl. No.: 711,476

[22] Filed: Sep. 6, 1996

Related U.S. Application Data

[63] Continuation of Ser. No. 355,121, Dec. 13, 1994, abandoned.

[51] Int. Cl.[6] ........................................... G03F 7/027
[52] U.S. Cl. .......................... 430/284.1; 522/96; 522/94
[58] Field of Search .......................... 430/284.1; 522/96, 522/94

[56] References Cited

U.S. PATENT DOCUMENTS

| | | | |
|---|---|---|---|
| 3,509,234 | 4/1970 | Burlant et al. | 522/96 |
| 3,658,531 | 4/1972 | Kurtz | 96/36.3 |
| 3,660,145 | 5/1972 | Johnson et al. | 522/96 |
| 3,782,961 | 1/1974 | Takahashi et al. | 430/284 |
| 3,850,770 | 11/1974 | Juna et al. | 522/96 |
| 3,960,572 | 6/1976 | Ibata et al. | 96/115 P |
| 4,006,204 | 2/1977 | Ibata et al. | 96/115 |
| 4,057,431 | 11/1977 | Finelli et al. | 96/115 |
| 4,133,723 | 1/1979 | Howard | 204/15 |
| 4,139,436 | 2/1979 | Jasani | 204/159 |
| 4,202,696 | 5/1980 | Takahashi et al. | 430/306 |
| 4,209,582 | 6/1980 | Merrill et al. | 430/308 |
| 4,221,646 | 9/1980 | Finelli et al. | 204/159 |
| 4,264,705 | 4/1981 | Allen | 430/271.1 |
| 4,283,480 | 8/1981 | Davies et al. | 430/284 X |
| 4,289,838 | 9/1981 | Rowe et al. | 430/284 X |
| 4,387,139 | 6/1983 | Herwig et al. | 428/423 |
| 4,716,094 | 12/1987 | Minonishi et al. | 430/284.1 |
| 5,204,222 | 4/1993 | Gersdorf et al. | 430/281.1 |
| 5,288,571 | 2/1994 | Nakamura et al. | 430/284 X |

OTHER PUBLICATIONS

*Encyclopedia of Polymer Science and Engineering*, vol. 13, "Polyurethanes", pp. 243–253, 299–303 (John Wiley & Sons, Inc. New York, NY, 1988).

*Primary Examiner*—Cynthia Hamilton
*Attorney, Agent, or Firm*—John L. Cordani

[57] ABSTRACT

A photosensitive resin composition includes a urethane oligomer prepared from a hydroxy-functionalized acrylate and/or methacrylate, at least one diol, and 2,4-toluene diisocyanate and 2,6-toluene diisocyanate in a 65:35 weight ratio. The resin composition additionally contains a monomer having at least one acrylate or methacrylate group, and a photoreactive initiator. The photosensitive resin composition may be cured to provide a soft photopolymer printing plate, particularly well suited for printing on corrugated bard.

4 Claims, No Drawings

SOFT RELIEF PHOTOPOLYMER PRINTING PLATES FOR FLEXOGRAPHIC PRINTING

This application is a continuation of application Ser. No. 08/355,121, filed Dec. 13, 1994, now abandoned.

FIELD OF THE INVENTION

The present invention relates to a photosensitive resin composition, to soft printing plates made therefrom, and to a method of printing therewith.

BACKGROUND OF THE INVENTION

In flexographic printing, also known as relief printing, ink is transferred from a pool of ink to a substrate byway of a printing plate. The surface of the plate is shaped so that the image to be printed appears in relief, in the same way that rubber stamps are cut so as to have the printed image appear in relief on the surface of the rubber. Typically, the plate is mounted on a cylinder, and the cylinder rotates at high speed such that the raised surface of the printing plate contacts a pool of ink, is slightly wetted by the ink, then exits the ink pool and contacts a substrate web, thereby transferring ink from the raised surface of the plate to the substrate to form a printed substrate.

Flexographic printing competes with other forms of printing, e.g., lithography, gravure and letterpress printing. Those involved in the flexographic printing industry are constantly striving to improve the flexographic printing process in order to more effectively compete with other printing methods. One area which has received much attention from researchers is the development of improved plates for flexographic printing.

The demands placed on flexographic printing plates are numerous. For instance, a flexographic printing plate must have sufficient flexibility (a mechanical property) to wrap around a printing cylinder, yet be strong enough to withstand the rigors experienced during typical printing processes. Further, the printing plate should possess a low hardness to facilitate ink transfer during printing. It is also important that the surface of the printing plate be dimensionally stable during storage. For example, some compositions used for making plates have shown inferior stability properties in that they become tacky and pasty during storage.

In the early days of flexographic printing, a rubber printing plate was produced by direct engraving on a rubber plate. Another early mode of preparing flexographic plates was first producing an original engraved plate by etching of a metallic plate, then forming a plastic matrix in the form of the metallic plate, followed by pouring rubber into the matrix plate and vulcanizing the rubber. These methods for preparing what may be termed a conventional printing plate, are complex and require considerable expertise to provide a satisfactory product. Since these manufacturing processes require many steps, they are expensive and very time-consuming.

In order to overcome the shortcomings of conventional plates, there has recently been proposed a method of producing a flexographic printing plate from a photosensitive, also known as photopolymerizable or photocurable, resin composition. These so-called photopolymer plates are rapidly coming into general use in various fields of printing because of their better handleability, higher productivity, lower price, and improved printing performance as compared with a conventional printing plate.

Photopolymerizable resin compositions generally comprise an elastomeric binder, herein sometimes referred to as a oligomer, at least one monomer and a photoinitiator. To prepare the plates, there is generally formed a photopolymerizable layer interposed between a support and one or more cover sheets that may include slip and release films to protect the photosensitive surface. Prior to processing the plate, the cover sheet(s) may be removed, and the photosensitive surface exposed to actinic radiation in an imagewise fashion, i.e., through a mask. Upon imagewise exposure to actinic radiation, polymerization, and hence, insolubilization of the photopolymerizable layer occurs in the exposed areas. Treatment with a suitable developer removes the unexposed areas of the photopolymerizable layer leaving a printing relief which can be used for flexographic printing.

Many different elastomeric materials have been investigated for the preparation of the photopolymer plates. These include polyamide-based photopolymer (containing a polyamide as an essential component) which dissolves or swells in a washout solution (typically, water, alkaline aqueous solution, or alcohol), a polyvinyl alcohol-based photopolymer (containing polyvinyl alcohol as an essential component), a polyester-based photopolymer (containing a low-molecular weight unsaturated polyester as an essential component), an acrylic-based photopolymer (containing a low-molecular weight acrylic polymer as an essential component), a butadiene copolymer-based photopolymer (containing a butadiene or isoprene/styrene copolymer as an essential component), or a polyurethane-based photopolymer (containing polyurethane as an essential component).

Methacrylate- or acrylate-terminated polyurethane oligomers diluted with various methacrylate and/or acrylate monomers and a photoinitiator are described in U.S. Pat. Nos. 4,006,024 and 3,960,572. The entire disclosures of U.S. Pat. Nos. 4,006,024 and 3,960,572 are incorporated herein by reference.

U.S. Pat. Nos. 4,006,024 and 3,960,572, both assigned to Asahi Chemical, disclose photosensitive resin compositions comprising at least one prepolymer having a number average molecular weight of about 800 to 20,000, at least one polymerizable ethylenically unsaturated monomer, and a photopolymerization initiator. The prepolymer is comprised of polyether diol(s) reacted with diisocyanate, such as an 80:20 mixture of the 2,4- and 2,6- isomers of toluene diisocyanate (TDI). The '024 patent provides numerous examples of photosensitive resin compositions, but those examples which employ TDI invariably use an 80:20 mixture of the 2,4- and 2,6- isomers of toluene diisocyanate. The photopolymer printing plates produced from these photosensitive resins have a hardness of from 34 to greater than 75 as measured on the Shore A scale.

U.S. Pat. No. 4,057,431, assigned to Goodyear, discloses using a liquid ethylenically unsaturated polyurethane composition to make soft relief printing plates with a hardness of at least 30 Shore A, wherein the unsaturated polyurethane is made with trimethylhexamethylene diisocyanate (TMHDI).

U.S. Pat. No. 3,850,770 discloses the use of toluene diisocyanate to prepare polyurethanes for radiation curable compositions.

U.S. Pat. No. 5,228,571 teaches the use of photosensitive ethylenically unsaturated polyetherurethanes for the production of printing plates wherein at least 20% of the polyether diol is specifically poly(tetrahydrofuran). The '571 patent discloses the use of toluene diisocyanate for the preparation of the polyetherurethanes.

U.S. Pat. No. 5,204,222 discloses the use of toluene 2,4-diisocyanate, toluene 2,6-diisocysnate or mixtures thereof for the preparation of photocurable elastomeric mixtures.

U.S. Pat. No. 4,264,705 discloses the use of diisocyanates, including 2,4-toluene diisocyanate and 2,6-toluene diisocyanate in the preparation of multilayered elastomeric printing plates.

There is a need in the art for photosensitive resin compositions for the preparation of low-cost, soft relief photopolymer printing plates, where such printing plates are especially suited for printing on corrugated substrate, and yet meet or exceed the printing quality and durability demanded by the printing industry.

SUMMARY OF THE INVENTION

The present invention provides a photosensitive resin composition comprising (i) a urethane oligomer; (ii) a monomer having at least one ethylenically unsaturated group; and (iii) a photopolymerization initiator. The urethane oligomer is the reaction product of polyol, hydroxy-functionalized acrylate or methacrylate, and a mixture of toluene diisocyanate and 2,6-toluene diisocyanate in a weight ratio of about 60:40 to about 70:30. That is, the mixture of 2,4-toluene diisocyanate and 2,6-toluene diisocyanate contains about 60–70 percent of the 2,4-isomer, and about 40–30 percent of the 2,6-isomer.

Another aspect of the invention is a printing plate for use in printing a cellulosic sheet. The printing plate comprises a layer of photosensitive resin coated on a substrate, which is subjected to image-wise exposure by actinic radiation, and subsequently developed. The photosensitive resin comprises the photosensitive resin composition described above.

Yet another aspect of the invention is a method for printing a cellulosic sheet which comprises delivering ink to the cellulosic sheet from the printing plate described above.

DETAILED DESCRIPTION OF THE INVENTION

A commercially important substrate for printing is liner board having a fluted backing, e.g., cardboard which has a layer of fluting between two flat sheets. The flat sheets, onto which printing is desirably placed, often have slight indentations due to the uneven support of the underlying fluting. In order to use relief plates to print on corrugated cellulosic substrates possessing such an uneven surface, it is desirable to have as soft a printing plate as possible, so that it may more readily conform to the surface of the corrugated board. Of course, a plate should not gain low softness at the expense of other important properties, such as durability and resilience.

Printing plates with Shore A hardness values of less than about 35, are desired for printing on corrugated boards. Such printing plates can be made from photosensitive resins comprising a reactive polyurethane, which may be prepared from an aliphatic diisocyanate, such as trimethylhexamethylene diisocyanate (TMDHDI), or other branched aliphatic diisocyanates, such as some of those listed in U.S. Pat. No. 4,006,024. However, printing plates prepared from aliphatic diisocyanates tend to leave poor resilience. In addition, aliphatic diisocyanates such as TMHDI are extremely expensive, costing on the order of $10–$11 per pound. For reference, toluene diisocyanate costs about $1.50 per pound.

The present invention provides photopolymerizable, also known as photocurable, resins which can be used to prepare flexible printing plates having a Shore A hardness of less than about 35, preferably less than about 30 and more preferably about 20 to about 30, when measured at 20° C. In addition, printing plates made from the photopolymerizable resins of the invention may have Bayshore resilience values of 20% or more, preferably about 25% to about 50%, when measured at 23° C. Furthermore, the inventive composition does not require the use of high-cost raw materials, such as trimethylhexamethylene diisocyanate, but can be produced from low-cost ingredients such as toluene diisocyanates.

It has now been surprisingly found that by careful control of the ratio of the isomers in a mixture of 2,4- and 2,6-toluene diisocyanate (TDI), a photopolymer plate having a low hardness and otherwise acceptable properties can be achieved. By using a mixture of the 2,4- and 2,6- isomers of TDI in a ratio of about 60:40 to about 70:30, and preferably about 65:35, urethane oligomers can be prepared which can be used to prepare photosensitive resins which give printing plates having a hardness of less than about 35, preferably less than about 30, and more preferably of about 20 to about 30 on the Shore A scale, when measured at 20° C. Surprisingly, the printing plates of the invention have sufficient tensile strength to give good durability. An additional desirable feature of the printing plates of the invention is that they have a Bayshore resilience of 20% or more, preferably about 25% to about 50%.

The photosensitive resins and flexible printing plates produced therefrom of the invention are comprised of (i) a urethane oligomer which is the reaction product of (a) a mixture of the 2,4- and 2,6- isomers of toluene diisocyanate in a weight ratio of about 60:40 to about 70:30, and preferably a 65:35 mixture of the 2,4- and 2,6-isomers of toluene diisocyanate, (b) at least one polyol, preferably at least one of a polyether diol and a polyester polyol, and more preferably a mixture of polyether diol and polyester diol, where (a) and (b) react to form an isocyanate-terminated oligomer, which is then reacted with (c) a hydroxy-functionalized acrylate or methacrylate, which provides polymerizable ethylenic unsaturatation at the termini of the urethane oligomer. The photosensitive resins of the invention further comprise at least one ethylenically unsaturated monomer (ii) and a photopolymerization initiator (iii).

The diisocyanate used in this invention is preferably a 65:35 mixture of the 2,4- and 2,6- isomers of TDI, which is sold by Miles Inc. (Pittsburgh, Pennsylvania) as MondurTD®, or the "TD grade" of TDI. This isomer mixture contains between about 64% and 67% of the 2,4-isomer and between about 33% and 36% of the 2,6- isomer of toluene diisocyanate.

The diisocyanate is preferably reacted with a polyol in the preparation of the isocyanate-terminated polyurethane oligomer of the present invention. The term polyol is used in its traditional sense, as a chemical having at least two hydroxy, sometimes called alcohol groups (represented by —OH), and having no limitation regarding other functionality which may be present as part of the polyol. A diol is an example of a polyol, where the number of hydroxy groups is exactly two.

The preferred polyols according to the invention are the polyether diols and polyester diols described in U.S. Pat. No. 4,006,024, the entire disclosure of which is herein incorporated by reference. The polyether diols are generally prepared by polymerization of alkylene oxide(s), and thus may be referred to as poly(alkylene oxide) diols. The polyether diol and polyester diol may be reacted alone with the toluene diisocyanate, or may be reacted together. According to a preferred embodiment of the invention, the diol component is a mixture of polyether diol, and polyester diol having terminal hydroxy groups, where the ratio of the polyols are as given in U.S. Pat. No. 4,006,024. The polyols of the '024 patent can either be reacted sequentially, or individually, as described in the '024 patent, with the TDI mixture of the instant invention. Alternatively, the polyols can be mixed together before reacting with the TDI mixture of the invention.

It is preferred to react the diisocyanate in equivalent excess with the polyol, in order that isocyanate terminated polyurethane oligomers are produced. The molar ratio of diol component to diisocyanate component is preferably between about 1.0:1.08 and 1.0:1.5, and more preferably between about 1.0:1.12 and 1.0:1.3. The number average molecular weights of the polyurethane oligomers are preferably between about 6,000 and 20,000, and more preferably between about 8,000 and 18,000, and most preferably between about 10,000 and 16,000. Molecular weights are measured by liquid chromatography, using polystyrene standards.

Preferably, the reaction between the polyol and the diisocyanate is achieved by contacting the reactants in the presence of a catalyst, preferably di(n-octyl)tin S,S'-bis-(isooctyl mercaptoacetate) at a concentration of about 120 ppm. Other catalysts known in the art may also be employed. A preferred reaction temperature may be about 60° C., at which temperature the reaction time will be approximately 4.0 hours.

After reacting the polyether and polyester diols with an excess of diisocyanate, to give an isocyanate-terminated polyurethane oligomer, the oligomer is reacted with a hydroxy acrylate or hydroxy methacrylate to introduce ethylenic unsaturation into the oligomer. Suitable hydroxyacrylates and hydroxymethacrylates include, without limitation, 2-hydroxypropyl acrylate, polypropylene glycol monoacrylate, acrylated caprolactone oligomers including acrylated caprolactone dimer, 2-hydroxypropyl methacrylate, polypropylene glycol monomethacrylate, and methacrylated caprolactone oligomers including methacrylated caprolactone dimer. Suitable hydroxy methacrylate and hydroxy acrylate compounds include all those disclosed in U.S. Pat. No. 4,006,024, including the suitable alcohols (I) described therein. Particularly preferred hydroxy-functionalized acrylate and methacrylate compounds include polypropylene glycol monomethacrylate, hydroxypropyl methacrylate and acrylated caprolactone dimer and oligomers such as Tone M-100 (Union Carbide Corp., Danbury Conn.) and mixtures thereof.

The second component (ii) of the photosensitive resin composition of the invention is known herein as a monomer. The monomer of the instant invention has one or more ethylenically unsaturated groups that will undergo a polymerization reaction. A preferred monomer is a mono- or poly- acrylic or methacrylic compound, including esters thereof.

The incorporation of a compound having two or more ethylenically unsaturated groups in the molecule into a photosensitive resin composition increases the hardness of the printing plate made therefrom. Therefore, the amount of such compound in the photosensitive resin composition should be controlled so that a printing plate having the desired hardness is obtained. For this reason, it is preferred that the monomer be a mixture of a monomethacrylate ester, monoacrylate ester, polymethacrylate ester and polyacrylate ester.

Exemplary monomers are the esters of acrylic acid and/or methacrylic acid with monohydric or polyhydric alcohols, and include, for example and without limitation, butyl acrylate, 2-ethylhexyl acrylate, isodecyl acrylate, lauryl acrylate, phenoethoxy acrylate, ethylene glycol diacrylate, 2-hydroxyethyl acrylate, hexane-1,6-diol diacrylate, 1,1,1-trimethylolpropane triacrylate, di, tri, and tetraethylene glycol diacrylate, tripropylene glycol diacrylate, pentaerythritol tetraacrylate, propoxylated trimethylolpropane mono- di- and tri-acrylate, ethoxylated trimethylolpropane triacrylate, and oligomeric polybutadienes with acrylic acid, i.e., oligomeric polybutadienes possessing activated, photopolymerizable olefinic double bonds, butyl methacrylate, 2-ethylhexyl methacrylate, isodecyl methacrylate, lauryl methacrylate, phenoethoxy methacrylate, ethylene glycol dimethacrylate, 2-hydroxyethyl methacrylate, hexane-1,6-diol dimethacrylate, 1,1,1-trimethylolpropane trimethacrylate, di, tri, and tetraethylene glycol dimethacrylate, tripropylene glycol dimethacrylate, pentaerythritol tetramethacrylate, propoxylated trimethylolpropane mono- di- and tri-methacrylate, ethoxylated trimethylolpropane trimethacrylate, and oligomeric polybutadienes with methacrylic acid, i.e., oligomeric polybutadienes possessing activated, photopolymerizable olefinic double bonds.

Preferred monomers are laurylmethacrylate, polypropyleneglycol monomethacrylate, phenoethoxymethacrylate, trimethylolpropane trimethacrylate, tetraethyleneglycol dimethacrylate and propoxylated trimethylolpropane trimethacrylate.

The proportion of monomer in the photosensitive resin formulation of the invention is dictated at least in part by the desired viscosity of the resulting liquid photosensitive resin. The greater the amount of monomer incorporated into the photosensitive resin, the lower is the resultant viscosity of the resin, for a given molecular weight of urethane oligomer. The viscosity of the photosensitive resin is preferably between about 10,000 cps and about 100,000 cps, and more preferably between about 20,000 cps and about 50,000 cps. Most preferably, it is from about 25,000 cps to about 40,000 cps. Viscosity may be measured using a Brookfield cone and plate viscometer, e.g., model DV-II+, available from Brookfield Engineering Laboratories, Inc., Stoughton, Mass. The amount of monomer required for a given molecular weight urethane oligomer in order to achieve a given viscosity for the photosensitive resin can be readily determinedly one skilled in the art without undue experimentation.

The thickness of a printing plate for printing on a corrugated board is typically from about 0.125 inches to about 0.250 inches. The thickness of the relief layer of such printing plates is typically from about 0.040 inches to about 0.125 inches, depending on the thickness of the printing plate. A photosensitive resin having a viscosity as set forth above minimizes the flow that might occur during the formation of a layer of said thickness that would cause undesired variations in the thickness of the photosensitive resin layer, but still makes for easy handling and transferring of the photosensitive resin during manufacturing. Flexographic printing plates for printing on substrates other than corrugated boards may require plate thicknesses other than those above.

Typically, the monomer is present in from about 10 to about 35 weight percent of the photopolymerizable resin composition, and more preferably in from about 15 to about 30 weight percent of the mixture.

The third component of the photosensitive resin composition of the invention is a photopolymerization initiator (iii). There is no particular limitation with respect to the type of photopolymerization initiator that may be used in the present invention. Therefore, any commonly used photopolymerization initiator customarily used in photosensitive resin compositions may be employed.

As the photopolymerization initiator used in the present invention, use may be made of one or more than one of acenaphthenequinone, acylphosphineoxide, α-aminoacetophenone, benzanthraquinone, benzoin methyl ether, benzoin isopropyl ether, benzoin n-butyl ether, benzoin isobutyl ether, benzophenone, benzoyldimethylketal, benzophenone, benzil dimethyl acetal, benzil 1-methyl 1-ethyl acetal, camphorquinone, chloroacetophenone, 2-chlorothioxanethone, dibenzosuberone, 2,2-diethoxy-2-phenylacetophenone, 2,2-diethoxyacetophenone, 2-dimethoxybenzoyldiphenylphosphine oxide, 2,2-dimethoxy-2-phenylacetophenone, i.e., Irgacure® 651 (Ciba-Geigy Corp., Hawthorne, N.Y.), 4,4'-bis (dimethylamino)benzophenone, 2-ethylanthraquinone, ethyl 2,4,6-trimethylbenzoylphenyl phosphinate, glyuxyester, hexanophenone, hydroxyacetophenone, 2-hydroxy-2-methylpropiophenone, 2-hydroxy-2-methyl-4'-isopropylisopropiophenone, 1-hydroxycyclohexyl phenyl ketone, 3-ketocoumarin, o-methoxybenzophenone, (methyl) -benzoylbenzoate, methylbenzoyl formate, Michler's ketone, 4'-morpholinodeoxybenzoin, 4-morpholinobenzophenone, alpha-phenylbutyrophenone, sodium 2,4,6-trimethylbenzoylphenylphosphinate, thioxanone, thioxanethone, 10-thioxanthenone, thioxanthen-9-one, tetramethylthiuram monosulfide, 3,3',4, 4'-tetra(t-butylperoxicarbonyl)-benzophenone, trichloroacetophenone, 2,4,6-trimethylbenzoyldiphenylphosphine oxide, valerophenone, axanethone, p-diacetylbenzene, 4-aminobenzophenone, 4'-methoxyacetophenone, benzaldehyde, alpha-tetralone, 9-acetylphenanthrene, 2-acetylphenanthrene, 3-acetylphenanthrene, 3-acetylindone, 9-fluorenone, 1-indanone, 1,3,5-triacetylbenzene, xanthene-9-one, 7-H-benz[de]anthracen-7-one, 1-naphthaldehyde, 4,4'-bis (dimethylamino)-benzophenone, fluorene-9-one, 1'-acetonaphthone, 2'-acetonaphthone, 2,3-butanedione, acetonaphthene benz[a]anthracene 7,12 diene, etc. Phosphines such as triphenylphosphine and tri-o-tolylphosphine are also operable herein as photoinitiators.

The photoinitiator can be used alone or in combination with coinitiators, e.g., ethylanthraquinone with 4,4',-bis (dimethylamino)benzophenone, benzoin methyl ether with triphenylphosphine, diacylphosphine oxides with tertiary amines or acyldiarylphosphine oxides with benzil dimethyl acetal.

The amount of the photopolymerization initiator can be any effective concentration which will allow the formation of a floor layer to the flexographic printing plate via a back exposure of a reasonable length of time and the formation of the relief image with the required image resolution. This time is related to the type of image being formed, as well as the thickness of the desired flexographic printing plate. The effective amount of photopolymerization initiator is dependent on the type of initiator chosen.

A concentration range of 0.1–10 wt % photoinitiator is preferred. Generally, when the amount of photoinitiator is less than 0.1%, the ultraviolet setting density is lowered and the physical properties of the photopolymer plate are extremely lowered. Generally, when the photoinitiator amount exceeds 10 wt %, no beneficial effect is observed for any property, and the cost of the formulation becomes commercially undesirable.

A preferred photoinitiator is 2,2-dimethoxy-2-phenylacetophenone, which may be present in the photopolymerizable mixture of the invention in an amount of from about 0.1% to about 5%, preferably about 0.1% to about 1.5%, and more preferably from about 0.15% to about 0.5%.

To protect the photopolymerizable mixtures from decomposition by thermal oxidation and oxidation by atmospheric oxygen, effective amounts of conventional antioxidants may be added to the mixture. Exemplary antioxidants are, for example, sterically hindered monophenols, such as 2,6-di-tert-butyl-p-cresol (BHT), alkylated thiobisphenols and alkylidenebisphenols, such as 2,2-methylenebis- (4-methyl-6-tert-butylphenol) or 2,2-bis (1-hydroxy-4-methyl-6-tert-butylphenyl ) sulfide, hydroxybenzyls, such as 1,3,5-trimethyl-2,4,6-tris-(3,5-di-tert-butyl-4-hydroxybenzyl) benzene, triazines, such 2-(4-hydroxy-3,5-tert-butylanilino) -4,6-bis-(n-octylthio)-1,3,5-triazine, polymerized trimethyldihydroquinone, dibutylzinc dithiocarbamate, dilauryl thiodipropionate and phosphites, such as tris (nonylphenyl) phosphite. BHT is a preferred antioxidant.

In some circumstances, the surface tack of the printing plates of the instant invention is too high, resulting in plates sticking together during storage, increased difficulty in handling, and the adhering of paper dust and fibers to the surface of the printing plates. To reduce or eliminate the tack in the surface of the plate, tack reducing additives can be incorporated into the liquid resin as disclosed in U.S. Pat. No. 4,716,094. The entire disclosure of U.S. Pat. No. 4,716,094, is incorporated herein by reference.

The photosensitive resins of the present invention can be cured by exposure to actinic radiation followed by removal of unpolymerized resins by washing with an aqueous detergent solution to provide photopolymer printing plates which have a Shore A hardness of less than about 35, preferably about 30 or less, and more preferably of about 20 to about 30 when measured on the Shore A scale at 20° C., and a Bayshore resilience, as measured with a Bayshore resiliometer of 20% or more, preferably about 25% to about 50%, when measured at 23° C. Hardness may be measured according to ASTM method D2240 using a Shore type A durometer gauge, model 100, available from Shore Instruments and Manufacturing Co.

The preparation of a printing plate from the photosensitive resin of the instant invention can be accomplished by any customary method used with other photosensitive resins. That is, the photosensitive resin may be provided as a layer of uniform thickness between a substrate backing sheet and a cover sheet facing a photographic negative, and subjecting the layer to a back exposure and/or image exposure, preferably both, with actinic radiation, followed by development of the plate.

The substrate backing sheet, also known as the support, can be any flexible material which is conventionally used with photosensitive elements used to prepare flexographic printing plates. Examples of suitable substrate materials include polymeric films such as those formed by addition polymers and linear condensation polymers, transparent foams and fabrics. A preferred substrate is a polyester film; particularly preferred is polyethylene terephthalate. The substrate typically has a thickness from 2 to 10 mils (0.0051 to 0.025 cm), with a preferred thickness of 3 to 8 mils (0.076 to 0.020 cm).

Examples of suitable sources of actinic radiation are sunlight and commercial UV fluorescent tubes, medium pressure, high pressure and low pressure mercury lamps, superactinic fluorescent tubes, pulsed xenon lamps, lamps doped with metal iodides and carbon arc lamps. Preferably, the photopolymer plates used in the present invention are cured with ultraviolet rays having a wavelength of 150–500 nm, especially 300–400 nm, which are generated by a low-pressure mercury lamp, high-pressure mercury lamp, carbon arc lamp, ultraviolet fluorescent lamp, chemical lamp, xenon lamp, or zirconium lamp.

There are several types of apparatus in practical use for the development of photopolymer plates. One forms the relief by blowing off the unexposed part by means of compressed air. Another forms the relief by spraying the washout solution under pressure to the plate. Yet another forms the relief by rubbing a brush against the plate fixed to a flat surface or cylinder, thereby agitating the washout solution against the plate and dissolving the unexposed part in the solution. It is preferred that the photopolymer plate, after curing by exposure to one of the above-mentioned light source, be developed with a developer, also known as a washout solution, which removes the unexposed non-image part. This process forms a relief image on the photopolymer plate. The unexposed part which has been removed by the washout solution remains in the form of emulsion or suspension in the washout solution in the washout bath.

Suitable apparatus for curing and developing photopolymer plates are the Merigraph® exposure mits, available from Hercules Incorporated, Wilmington, Del.

It is preferred to use an aqueous developer. The developer is most desirably water (tap water) having a pH of 5.0–9.0 which may optionally contain an alkaline compound (such as sodium hydroxide and/or sodium carbonate), surfactant, and water- soluble organic solvent. The addition of a surfactant is desirable in order to get the photopolymer to readily disperse into water and to remain dispersed in water. Preferred surfactants are sodium alkyl-naphthalenesulfonate and sodium alkylbenzenesulfonate. Other examples of the surfactant include anionic surfactants containing a carboxylate, sulfate-ester, sulfonate, or phosphate-ester; nonionic surfactants such as polyethylene glycol derivative, polyhydric alcohol derivative, and sorbitan derivative; cationic surfactants containing a primary, secondary or tertiary amine salt, or a quaternary ammonium salt; and amphoteric surfactants containing an amino acid hydrophilic group or a betaine hydrophilic group. The washout solution should generally be used at 25°–50° C., preferably 30°–40° C. The concentration of the surfactant in water is not limited, but is generally in the range of about 0.5% to about 4%. While the plate is most often developed by spray washing with the aqueous developer solution, other techniques, including those mentioned above, may be used as well.

After developing, photopolymer flexographic printing plates generally retain at least some degree of surface tackiness, particularly on the "shoulders" of the relief and other non-image areas. Excessive surface tackiness is undesirable in a printing relief. Several methods have been developed to reduce surface tack, and may be applied to the printing plates of the invention. For example, it is well known in the art that exposure to short wavelength irradiation, such as is known from U.S. Pat. No. 4,202,696, incorporated herein by reference in its entirety, can reduce surface tack by post curing the plate with short wavelength actinic radiation after exposure to certain carbonyl compounds including benzophenone.

The printing plate according to the present invention will have a Shore A hardness of less than about 35 at 20° C., preferably about 30 or less. A printing plate having a hardness within the range of the invention is particularly suited for printing on uneven substrates, such as corrugated substrate. The printing plates of the invention readily provide a uniform ink coating on corrugated bard because they can conform to the slight indentations present on the surface of a corrugated board having fluting underneath. The printing plate of the invention is particularly suited for flexographic printing.

The following examples are provided to better disclose and teach the preparation of the photosensitive resin compositions and printing plates of the present invention. These examples are for illustrative purposes only, and it must be acknowledged that minor variations and changes can be made without materially affecting the spirit and scope of the invention as recited in the claims that follow. All units, percentages etc. are by weight unless otherwise indicated.

General Procedures

Printing plate hardness is measured according to ASTM method D2240 using a Shore type A durometer gauge, model 100, available from Shore Instrument and Manufacturing Co.

Viscosity measurements were obtained using a Brookfield cone and plate viscometer, model DV-II+, available from Brookfield Engineering Laboratories, Inc., Stoughton, Mass., operated at 25 ° C. using a number 52 spindle.

Printing plate resiliency is reported as Bayshore resilience, as provided by a Bayshore resiliometer operated at 23° C. according to a modification of ASTM method D2632-88 wherein the sample thickness is 0.250 inches. The Bayshore resiliometer may be obtained from Shore Instrument and Manufacturing, or from Precision Scientific Co.

In the Examples, Mondur TD® from Miles, Inc., Pittsburgh, Pa., which contains between 64% and 67% of 2,4-toluene diisocyanate (TDI) and between 36% and 33% of 2,6-toluene diisocyanate, was used for the 65:35 mixture of the 2,4- and 2,6- TDI isomers.

Each of the photopolymerizable compositions of the following examples was formed into a photopolymer printing plate according to the following procedure. Using a Merigraph® type 50 exposure unit, a 0.125" thick layer of the photosensitive resin composition was formed as a layer between an adhesive coated polyester backing sheet and a cover sheet of polypropylene film, which separated the photo resin from a photographic negative. The photopolymer was subjected to a back-side exposure of 1:30 minutes (i.e., 90 seconds), followed by an imaging exposure through the negative for 4:00 minutes. After the exposure, the cover sheet was removed and the uncured resin was removed by spray washing with an aqueous solution containing 2% by weight Merigraph® washout detergent 1695 (trade name of ionic detergent sold by Hercules Incorporated) and 2% by weight sodium triphosphate at 35°–40° C. for ten minutes to obtain a relief plate. Then the plate was immersed in an aqueous solution of sodium bisulfite and subjected to post exposure by actinic radiation having a minimum intensity of 8 Mw/cm² to completely cure the relief portion of the plate. The plate was then dried for 30 minutes at 40° C. Further, the plate may be subjected to a dry post-exposure step under germicidal lights for 10 minutes. The Shore A hardness and Bayshore resilience of each plate was measured as described above. Molecular weights as provided herein refer to number average molecular weight.

EXAMPLE 1

To a mixture of 500 parts by weight of polyethylene oxide/propylene oxide block copolymer (molecular weight 2000) (PolyG 55-53; Olin Corporation, Stamford, Conn.), which contains 30% by weight ethylene oxide, and 500 parts by weight of a polypropylene adipate polyester diol (S108; Ruco Polymer Corp., Hicksville, N.Y.) (molecular weight 2400) was added 88.5 parts by weight of a 65:35 mixture of the 2,4- and 2,6-isomers of toluene diisocyanate (TDI) and 120 ppm of di(n-octyl)tin S,S'-bis-(isooctyl mercaptoacetate) as the catalyst (T-831; M&T Chemicals, division of Elf Atochem, Philadelphia, Pa.). The resulting mixture was reacted at 60° C. for 4 hours to obtain a polyurethane oligomer having isocyanate groups at both ends of the molecule. To this was added 178 parts by weight of polypropylene glycol monomethacrylate (International Specialty Products, Wayne, N.J.) (molecular weight: 380) after which the reaction mixture was stirred at 80° C. until no residual isocyanate could be determined by titration with n-butylamine.

To 75 grams of the resulting urethane oligomer were added 3 grams of laurylmethacrylate(SR 313; Sartomer Co., Exton, Pa.), 11 grams of polypropyleneglycol monomethacrylate (International Specialty Products, Wayne, N.J.), 6 grams phenoethoxymethacrylate (Photomet 4039; Henkel Corp., Ambler, Pa.), 0.7 gram of trimethylolpropane trimethacrylate (SR 350; Sartomer Co., Exton, Pa.), 0.6 gram of tetraethyleneglycol dimethacrylate (SR 209; Sartomer Co., Exton, Pa.), 0.3 gram 2,2-dimethoxy-2-phenylacetophenone (Ciba Geigy Corp., Hawthorne, N.Y.), 2 grams myristic acid (Witco Chemical, Chicago, Ill.), 1 gram oleamide, 0.2 gram dimyristyl thiodipropionate and 0.2 gram of BHT. The resulting mixture was stirred for 2 hours to obtain a photosensitive resin composition.

The properties of the photopolymer plate prepared from this photosensitive resin composition, as well as the viscosity of the photosensitive resin composition, are provided in TABLE A.

EXAMPLE 2

To a mixture of 500 parts by weight of polyethylene oxide/propylene oxide block copolymer (molecular weight 2000), which contains 30% by weight ethylene oxide, and 500 parts by weight of a polypropylene adipate polyester diol (molecular weight 2400) was added 88.5 parts by weight of a 65:35 mixture of the 2,4- and 2,6- isomers of toluene diisocyanate and T-831 catalyst di (n-octyl) tin S,S'-bis-(isooctyl mercaptoacetate) (120 ppm), as in Example 1. The resulting mixture was reacted at 60° C. for 4 hours to obtain a polyurethane oligomer having isocyanate groups at both ends of the molecule. To this was added 99 parts by weight of polypropylene glycol monomethacrylate (molecular weight: 380) and 49.5 parts by weight of hydroxypropylmethacrylate, after which the reaction mixture was stirred at 80° C. until no residual isocyanate could be determined by titration with n-butylamine.

To 75 grams of this oligomer were added 9 grams of laurylmethacrylate, 12 grams of polypropyleneglycol monomethacrylate, 2.2 grams phenoethoxymethacrylate, 0.3 gram 2,2-dimethoxy-2-phenylacetophenone, 1 gram of myristic acid, 1 gram of oleamide and 0.1 gram of BHT. The resulting mixture was stirred for 2 hours to obtain a photosensitive resin composition.

The properties of the photopolymer plate prepared from this photosensitive resin composition, as well as the viscosity of the photosensitive resin composition, are provided in TABLE A.

EXAMPLE 3

To a mixture of 500 parts by weight of polyethylene oxide/propylene oxide block copolymer (molecular weight 2000), which contains 30% by weight ethylene oxide, and 500 parts by weight of a polypropylene adipate polyester diol (molecular weight 2400) was added 88.5 parts by weight of a 65:35 mixture of the 2,4- and 2,6- isomers of toluene diisocyanate and 120 ppm T-831 catalyst di(n-octyl) tin S,S'-bis-(isooctyl mercaptoacetate), as in Example 1. The resulting mixture was reacted at 60 ° C. for 4 hours to obtain a polyurethane oligomer having isocyanate groups at both ends of the molecule. To this was added 61 parts by weight of polypropylene glycol monomethacrylate (molecular weight: 380) and 141 parts by weight of hydroxypropylmethacrylate, after which the reaction mixture was stirred at 80° C. until no residual isocyanate could be determined by titration with n-butylamine.

To 75 grams of the resulting urethane oligomer were added 8.5 grams of laurylmethacrylate, 11 grams of polypropyleneglycol monomethacrylate, 0.6 gram of tetraethylene glycol dimethacrylate, 0.7 gram of propoxylated trimethylolpropane trimethacrylate (SR 492; Sartomer Co., Exton, Pa.), 0.3 gram 2,2-dimethoxy-2-phenylacetophenone, 2 grams of myristic acid, 1 gram of oleamide, 0.2 gram of dimyristyl thiodipropionate and 0.2 gram of BHT. The resulting mixture was stirred for 2 hours to obtain a photosensitive resin composition.

The properties of the photopolymer plate prepared from this photosensitive resin composition, as well as the viscosity of the photosensitive resin composition, are provided in TABLE A.

EXAMPLE 4

To 74 grams of urethane oligomer prepared as in Example 1 were added 8 grams of laurylmethacrylate, 10 grams of polypropyleneglycol monomethacrylate, 4 grams of phenoethoxymethacrylate, 0.5 gram of tetraethyleneglycol dimethacrylate, 1 gram of propoxylated trimethylolpropane trimethacrylate, 0.3 gram 2,2-dimethoxy-2-phenylacetophenone, 2 grams of myristic acid, 0.5 gram of lauryl thiodipropionate and 0.1 gram of BHT. The resulting mixture was stirred for 2 hours to obtain a photosensitive resin composition.

The properties of the photopolymer plate prepared from this photosensitive resin composition, as well as the viscosity of the photosensitive resin composition, are provided in TABLE A.

EXAMPLE 5

To 75 grams of urethane oligomer prepared as in Example 1 were added 9 grams of laurylmethacrylate, 12 grams of polypropyleneglycol monomethacrylate, 2.2 grams of tetraethyleneglycol dimethacrylate, 0.3 gram 2,2-dimethoxy-2-phenylacetophenone, 1 gram of myristic acid, 1 gram of oleamide and 0.1 gram of BHT. The resulting mixture was stirred for 2 hours to obtain a photosensitive resin composition.

The properties of the photopolymer plate prepared from this photosensitive resin composition, as well as the viscosity of the photosensitive resin composition, are provided in TABLE A.

EXAMPLE 6

To 75 grams of urethane oligomer prepared as in Example 2 were added 8.5 grams of laurylmethacrylate, 11.4 grams of polypropyleneglycol monomethacrylate, 0.6 gram of tetraethyleneglycol dimethacrylate, 0.7 grams of propoxylated trimethylolpropane trimethacrylate, 0.3 grams 2,2-dimethoxy-2-phenylacetophenone, 2 grams of myristic acid, 1 gram of oleamide, 0.2 gram of dimyristyl thiodipropionate and 0.2 grams of BHT. The resulting mixture was stirred for 2 hours to obtain a photosensitive resin composition.

The properties of the photopolymer plate prepared from this photosensitive resin composition, as well as the viscosity of the photosensitive resin composition, are provided in TABLE A.

EXAMPLE 7

To a mixture of 638 parts by weight of polyethylene oxide/propylene oxide block copolymer (molecular weight 2000) (Poly G 55-53; Olin Corporation, Stamford, Conn.), which contains 30% by weight ethylene oxide was added 64.7 parts by weight of a 65: 35 mixture of the 2,4- and 2,6- isomers of toluene diisocyanate (TDI) and 120 ppm di(n-octyl)tin S,S'-bis-(isooctyl mercaptoacetate). The resulting mixture was reacted at 60° C. for 4 hours to obtain a polyurethane oligomer having isocyanate groups at both ends of the molecule. To this was added 96 parts by weight of polypropylene glycol monomethacrylate (International Specialty Products, Wayne, N.J.) (molecular weight: 380) after which the reaction mixture was stirred at 80° C. until no residual isocyanate could be determined by titration with n-butylamine.

To 75 grams of the resulting urethane oligomer were added 9 grams of laurylmethacrylate(SR 313; Sartomer Co., Exton, Pa.), 7 grams of polypropyleneglycol monomethacrylate (International Specialty Products, Wayne, N.J.), 5 grams phenoethoxymethacrylate (Photomet 4039; Henkel Corp., Ambler Pa.), 1.2 gram of trimethylolpropane trimethacrylate(SR 350; Sartomer Co., Exton Pa.), 0.3 gram 2,2-dimethoxy-2-phenylacetophenone (Ciba Geigy, Hawthorne, N.Y.), 1 grams myristic acid (Witco Chemical, Chicago, Ill.), 1 gram oleamide, 0.1 gram dimyristyl thiodipropionate and 0.2 gram of BHT and the resulting mixture was stirred for 2 hours to obtain a photosensitive resin composition.

The properties of the photopolymer plate prepared from this photosensitive resin composition, as well as the viscosity of the photosensitive resin composition, are provided in TABLE A.

(PolyG 55-53; Olin Corporation, Stamford, Conn.), and 500 parts by weight of a polypropylene adipate polyester diol (molecular weight 2400) (S108; Ruco Polymer Corp., Hicksville, N.Y.) was added 89 parts by weight of an 80:20 mixture of the 2,4- and 2,6- isomers of toluene diisocyanate and 120 ppm of di(n-octyl)tin S,S'-bis-(isooctyl mercaptoacetate) (T-831; M&T Chemicals, division of Elf Atochem, Philadelphia, Pa.). The resulting mixture was reacted at 60° C. for 4 hours to obtain a polyurethane oligomer having isocyanate groups at both ends of the molecule. To this was added 61 parts by weight of polypropylene glycol monomethacrylate (molecular weight: 380) and 141 parts by weight of hydroxypropylmethacrylate, after which the reaction mixture was stirred at 80° C. until no residual isocyanate could be determined by titration with n-butylamine.

To 75 grams of the resulting urethane oligomer were added 3 grams of laurylmethacrylate, 11 grams of polypropyleneglycol monomethacrylate, 6 grams phenoethoxymethacrylate, 0.7 gram of trimethylolpropane trimethacrylate, 0.6 gram of tetraethyleneglycol dimethacrylate, 0.3 gram 2,2-dimethoxy-2-phenylacetophenone, 2 grams myristic acid, 1 gram oleamide, 0.2 gram dimyristyl thiodipropionate and 0.2 gram of BHT. The resulting mixture was stirred for 2 hours to obtain a photosensitive resin composition.

The properties of the photopolymer plate prepared from this photosensitive resin composition, as well as the viscosity of the photosensitive resin composition, are provided in TABLE B.

COMPARATIVE EXAMPLE 2

To 73 grams of the urethane oligomer prepared as in comparative example 1 were added 11 grams of lauryl methacrylate, 11 grams of polypropyleneglycol monomethacrylate, 0.7 gram of trimethylolpropane trimethacrylate, 0.6 gram of tetraethyleneglycol dimethacrylate, 0.3 gram 2,2-dimethoxy-2-phenylacetophenone, 0.1 gram of BHT, 2.0 grams of myristic acid, 1.0 gram of oleamide and 0.2 gram of dimyristyl

TABLE A

|  | Example 1 | Example 2 | Example 3 | Example 4 | Example 5 | Example 6 | Example 7 |
|---|---|---|---|---|---|---|---|
| Hardness (Shore A, 20° C.) | 24 | 26 | 27 | 21 | 24 | 23 | 27 |
| Tensile Strength (psi) | 782 | 582 | 649 | 571 | 678 | 482 | 831 |
| Elongation (%) | 315 | 334 | 326 | 300 | 360 | 348 | 291 |
| Bayshore Resilience (%) | 31 | 28 | 25 | 20 | 28 | 28 | 48 |
| Viscosity (cps) | 31,140 | 32,710 | 17,100 | 33,660 | 33,740 | 30,590 | 21,700 |

COMPARATIVE EXAMPLE 1

To a mixture of 500 parts by weight of polyethylene oxide/propylene oxide block copolymer (molecular weight 2000), which contains 30% by weight ethylene oxide thiodipropionate. The resulting mixture was stirred for 2 hours to obtain a photosensitive resin composition.

The properties of the photopolymer plate prepared from this photosensitive resin composition, as well as the viscosity of the photosensitive resin composition, are provided in TABLE B.

COMPARATIVE EXAMPLE 3

This comparative example shows that soft relief photopolymer printing plates can be prepared from a selected aliphatic diisocyanate, but the plate has an undesirably low resilience.

To a mixture of 500 parts by weight of polyethylene oxide/propylene oxide block copolymer (molecular weight 2000), which contains 30% by weight ethylene oxide, and 500 parts by weight of a polypropylene adipate polyester diol (molecular weight 2400) was added 104 parts by weight of 2,2,4-trimethylhexamethylene diisocyanate (TMHDI) and 120 ppm di(n-octyl)tin S,S'-bis-(isooctyl mercaptoacetate). The resulting mixture was reacted at 60° C. for 4 hours to obtain a polyurethane oligomer having isocyanate groups at both ends of the molecule. To this was added 61 parts by weight of polypropylene glycol monomethacrylate (molecular weight: 380) and 141 parts by weight of hydroxypropylmethacrylate, after which the reaction mixture was stirred at 80° C. until no residual isocyanate could be determined by titration with n-butylamine.

To 78 grams of the resulting urethane polymer were added 8 grams of laurylmethacrylate, 8 grams of polypropyleneglycol monomethacrylate, 0.8 grams of trimethylolpropane trimethacrylate, 1.3 grams of tetraethyleneglycol dimethacrylate, 0.3 gram 2,2-dimethoxy-2-phenylacetophenone, 0.1 gram of BHT, 1.6 grams of myristic acid and 1.6 grams of lauric acid. The resulting mixture was stirred for 2 hours to obtain a photosensitive resin composition.

The properties of the photopolymer plate prepared from this photosensitive resin composition, as well as the viscosity of the photosensitive resin composition, are provided in TABLE B.

COMPARATIVE EXAMPLE 4

To 73.6 grams of the urethane oligomer prepared as in comparative example 1 were added 8 grams of lauryl methacrylate, 10 grams of polypropyleneglycol monomethacrylate, 1 gram of propoxylated trimethylolpropane trimethacrylate, 0.5 gram of tetraethyleneglycol dimethacrylate, 0.3 gram 2,2-dimethoxy-2-phenylacetophenone, 0.1 gram of BHT, 2.0 grams of myristic acid and 0.5 grams of lauryl thiodipropionate. The resulting mixture was stirred for 2 hours to obtain a photosensitive resin composition.

The properties of the photopolymer plate prepared from this photosensitive resin composition, as well as the viscosity of the photosensitive resin composition, are provided in TABLE B. The data for Comparative Example 4 in TABLE B can be compared to the data for Example 6 in TABLE A to show that a printing plate prepared using an 80:20 ratio of the 2,4- and 2,6- isomers of toluene diisocyanate has a higher Shore A hardness and a lower Bayshore resilience than does a plate prepared from a 65:35 ratio of the 2,4- and 2,6- isomers of toluene diisocyanate.

TABLE B

|  | Comparative Example 1 | Comparative Example 2 | Comparative Example 3 | Comparative Example 4 |
|---|---|---|---|---|
| Hardness (Shore A, 20° C.) | 31 | 35 | 28 | 31 |
| Tensile Strength (psi) | 1090 | 1166 | 936 | 886 |
| Elongation (%) | 305 | 310 | 327 | 315 |
| Bayshore Resilience (%) | 21 | 20 | 16 | 22 |
| Viscosity (cps) | 30,480 | 29,451 | 27,406 | 26,960 |

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A photosensitive resin composition comprising
   (i) an urethane oligomer;
   (ii) a monomer having at least one ethylenically unsaturated group; and
   (iii) a photopolymerization initiator;
   wherein said urethane oligomer is the reaction product of a polyol, a hydroxy-functionalized acrylate or methacrylate, and a mixture of 2,4-toluene diisocyanate and 2,6-toluene diisocyanate in a weight ratio of, 65 to 35 respectively, and wherein said polyol is a mixture of a poly (alkylene oxide) diol and a polyester diol.

2. The composition of claim 1 wherein said hydroxy-functionalized acrylate or methacrylate is selected from the group consisting of polypropylene glycol monomethacrylate, hydroxypropyl methacrylate and acrylated caprolactone dimer.

3. The composition of claim 1 wherein said monomer (ii) is selected from the group consisting of laurylmethacrylate, polypropyleneglycol monomethacrylate, phenoethoxymethacrylate, trimethylolpropane trimethacrylate, tetraethyleneglycol dimethacrylate and propoxylated trimethylolpropane trimethacrylate.

4. The composition of claim 1 wherein said polyol is selected from the group consisting of polyether diol and polyester diol, said hydroxy-functionalized acrylate or methacrylate is selected from the group consisting of polypropylene glycol monomethacrylate, hydroxypropyl methacrylate and acrylated caprolactamdimer, and said monomer (ii) is selected from the group consisting of laurylmethacrylate, polypropyleneglycol monomethacrylate, phenoethoxymethacrylate, trimethylolpropane trimethacrylate and tetraethyleneglycol dimethacrylate.

* * * * *